United States Patent
Wang et al.

(10) Patent No.: US 10,797,721 B2
(45) Date of Patent: Oct. 6, 2020

(54) DIGITAL TO ANALOG CONVERTER, METHOD FOR DRIVING THE SAME, AND DISPLAY DEVICE

(71) Applicant: BOE Technology Group Co., Ltd., Beijing (CN)

(72) Inventors: Tangxiang Wang, Beijing (CN); Chen Song, Beijing (CN); Zhan Gao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/520,921

(22) Filed: Jul. 24, 2019

(65) Prior Publication Data

US 2020/0091928 A1  Mar. 19, 2020

(30) Foreign Application Priority Data

Sep. 13, 2018 (CN) .......................... 2018 1 1066860

(51) Int. Cl.
*H03M 1/78* (2006.01)

(52) U.S. Cl.
CPC .................................. *H03M 1/785* (2013.01)

(58) Field of Classification Search
CPC ...... H03M 1/785; H03M 1/765; H03M 1/682; H03M 1/661; H03M 1/72
USPC .................................................. 341/144, 154
See application file for complete search history.

(56) References Cited

U.S. PATENT DOCUMENTS

| | | | |
|---|---|---|---|
| 5,554,986 A * | 9/1996 | Neidorff ............... | H03M 1/682 341/145 |
| 6,975,261 B1 * | 12/2005 | Isham ................... | H03M 1/068 341/144 |
| 7,616,144 B2 * | 11/2009 | Mulder ............ | H03K 17/04106 341/118 |

* cited by examiner

*Primary Examiner* — Brian K Young
(74) *Attorney, Agent, or Firm* — Arent Fox LLP; Michael Fainberg (57) ABSTRACT

A digital to analog converter, a method for driving the same, and a display device are provided. The digital to analog converter includes: a first resistor string, $2^m$ first multiplexers, a first voltage selector, a second resistor string, a second voltage selector, and a second multiplexer, where the $2^m$ first multiplexers, the first voltage selector, and the second voltage selector operate in cooperation with each other so that the entire second resistor string can be connected in series to the first resistor string for further division.

10 Claims, 8 Drawing Sheets

DIGITAL TO ANALOG CONVERTER, METHOD FOR DRIVING THE SAME, AND DISPLAY DEVICE

CROSS-REFERENCES TO RELATED APPLICATION

This application claims priority to Chinese patent application No. 201811066860.X filed on Sep. 13, 2018, which is incorporated herein by reference in its entirety.

FIELD

The present disclosure relates to the field of integrated circuits, and particularly to a digital to analog converter, a method for driving the same, and a display device.

BACKGROUND

A Digital to Analog Converter (DAC) is an indispensable interface to digital and analog circuits, and has been increasingly applied to signal acquisition, digital communication, automatic control, and other technologies.

There are such a large number of switches required in the DAC that the structure of the DAC is complicated, and the DAC occupies a large area in a chip, and has high power consumption, thus hindering the competitiveness of the product from being improved.

SUMMARY

An embodiment of the disclosure provides a digital to analog converter including: a first resistor string, $2^m$ first multiplexers, a first voltage selector, a second resistor string, a second voltage selector, and a second multiplexer, wherein: the first resistor string includes: $2^m$ pairs of first resistors and first switches connected in series between a high-voltage reference signal terminal and a low-voltage reference signal terminal, wherein the first resistors have same resistance, and the first switches are initially turned on; and the $2^m$ first resistors constitute ($2^m+1$) first voltage dividing ends one-to-one corresponding to ($2^m+1$) input-output ends of the first voltage selector, wherein $2^m$ first voltage dividing ends are one-to-one coupled with $2^m$ input-output ends through the $2^m$ first multiplexers, and the remaining one first voltage dividing end is coupled directly with the remaining one input-output end; the $2^m$ first multiplexers are configured to connect the $2^m$ input-output ends with control ends of their corresponding $2^m$ first switches upon reception of a first control signal, and to connect the $2^m$ input-output ends with control ends of their corresponding $2^m$ first voltage dividing ends upon reception of a second control signal; the second resistor string includes $2^n$ second resistors connected in series between a high-voltage terminal of the first voltage selector, and the second multiplexer, wherein a sum of the resistances of the second resistors is equal to the resistance of a first resistor, and the $2^n$ second resistors constitute $2^n$ second voltage dividing ends; the second multiplexer is configured to connect the low-voltage terminal of the first voltage selector with the ground upon reception of the first control signal, and to connect the low-voltage terminal of the first voltage selector with the second resistor string upon reception of the second control signal; the first voltage selector is configured to select one of the first switches to be turned off, according to a received m-bit digital signal when the low-voltage terminal is grounded, and to select the second resistor string, instead of the first resistor paired with the turned-off first switch, to be connected in series to the first resistor string, according to the received m-bit digital signal when the low-voltage terminal is connected with the second resistor string; and the second voltage selector is configured to select a voltage signal at one of the second voltage dividing ends for output, according to a received n-bit digital signal.

Optionally in the digital to analog converter according to the embodiment of the disclosure, the first voltage selector includes a first switch tree with an m-bit digital signal, wherein the first switch tree includes $$2m + \sum_{i=1}^{m} 2^i$$

second switches, the m-bit binary digital signal is input in a reverse order, and the ($2^m+1$) input-output ends of the first switch tree are coupled respectively with the ($2^m+1$) first voltage dividing ends under a preset rule, so that adjacent voltages at the first voltage dividing ends are output respectively at the high-voltage terminal and the low-voltage terminal of the first voltage selector.

Optionally in the digital to analog converter according to the embodiment of the disclosure, the second voltage selector includes a second switch tree with an n-bit binary digital signal, wherein the second switch tree includes $$\sum_{i=1}^{n} 2^i$$

third switches, the n-bit binary digital signal is input in a forward order, and $2^n$ input terminals of the second switch tree are one-to-one coupled with the $2^n$ second voltage dividing ends in a linear input voltage order.

Optionally in the digital to analog converter according to the embodiment of the disclosure, m=n, and a resistance of a second resistor is $\frac{1}{2^m}$ of the resistance of a first resistor.

Optionally in the digital to analog converter according to the embodiment of the disclosure, the $2^m$ first multiplexers have control ends coupled with a control signal terminal, first ends coupled with their corresponding $2^m$ first voltage dividing ends, second ends coupled with the control ends of their corresponding $2^m$ first switches, and third ends coupled with the $2^m$ input-output ends; and the second multiplexer has a control end coupled with the control signal terminal, a first end coupled with the second resistor string, a second end grounded, and a third end coupled with the low-voltage terminal.

Optionally in the digital to analog converter according to the embodiment of the disclosure, the first multiplexer and the second multiplexer each includes: a first thin film transistor, a second thin film transistor, and an inverter, wherein: both an input end of the inverter, and a gate of the second thin film transistor are the control ends, and an output end of the inverter is coupled with a gate of the first thin film transistor; a source of the first thin film transistor is connected with a drain of the second thin film transistor, and is the third end; and a drain of the first thin film transistor is the second end a, and a source of the second thin film transistor is the first end.

Optionally in the digital to analog converter according to the embodiment of the disclosure, the digital to analog converter further includes a buffer connected with a voltage output end of the second voltage selector.

Optionally in the digital to analog converter according to the embodiment of the disclosure, the digital to analog converter further includes a latch connected between at least one of the input-output ends and the control end of its corresponding first switch.

In another aspect, an embodiment of the disclosure further provides a display device including the digital to analog converter according to any one of the technical solutions above.

In another aspect, an embodiment of the disclosure further provides a method for driving the digital to analog converter according to any one of the technical solutions above, the method including: a pre-decoding period and a decoding period, wherein: in the pre-decoding period, the first voltage selector selects one of the first switches to be turned off, according to a received m-bit digital signal; and in the decoding period, the first voltage selector selects the second resistor string, instead of the first resistor paired with the turned-off first switch, to be connected in series to the first resistor string, according to the received m-bit digital signal, and the second voltage selector selects a voltage signal at one of the second voltage dividing ends for output, according to a received n-bit digital signal.

DETAILED DESCRIPTION

Figure 1:
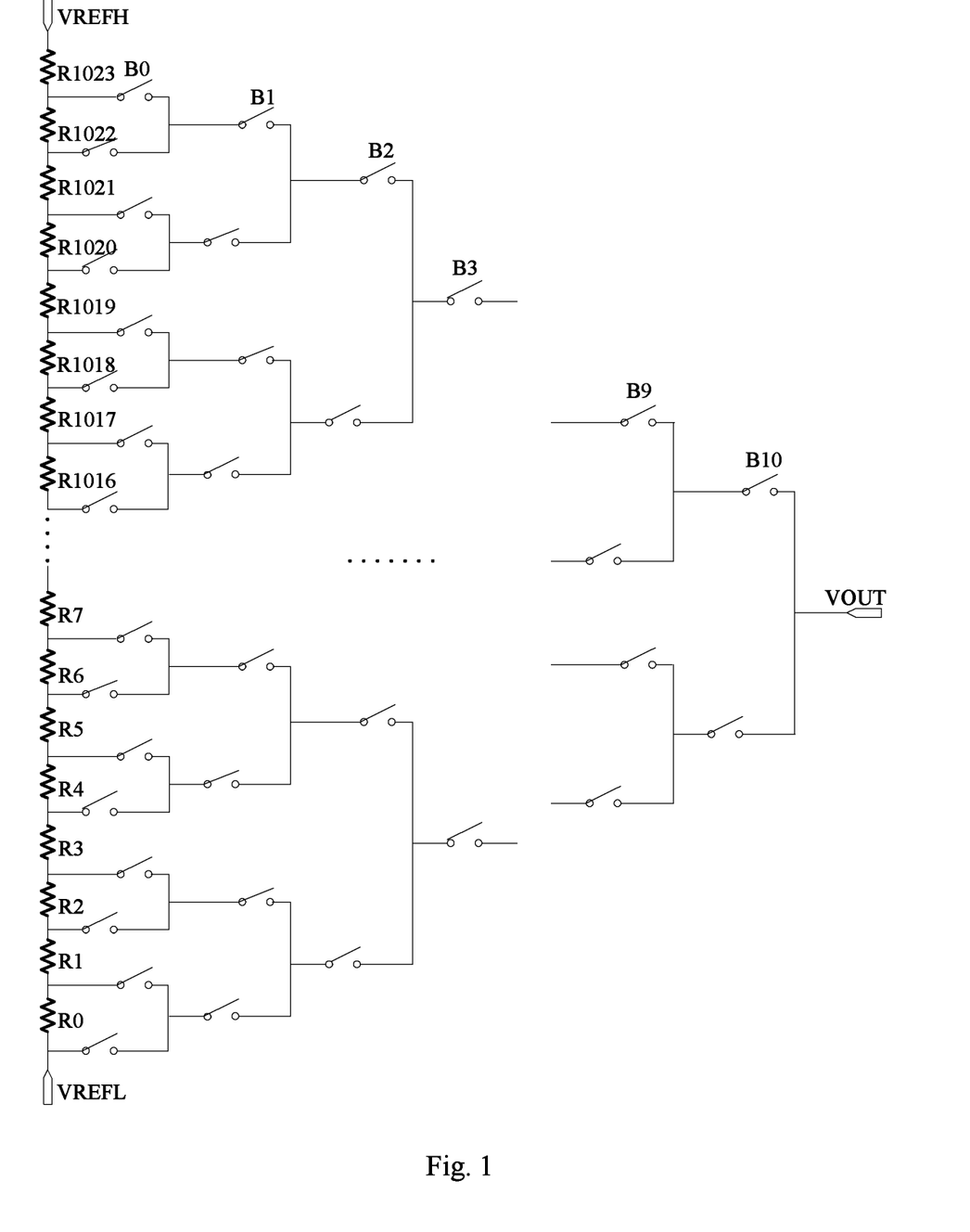
FIG. 1 is a schematic structural diagram of a resistor string DAC in the related art.

A resistor string DAC has the advantages of a simple structure, low spikes, high linearity, etc., and FIG. 1 illustrates a schematic structural diagram thereof; and as the precision thereof is improving, an array of voltage selection switches therein is exponentially growing, and the area of a chip thereof is significantly increasing, so the DAC in the this structure may not be applicable to a high-precision application scenario.

Figure 2A:
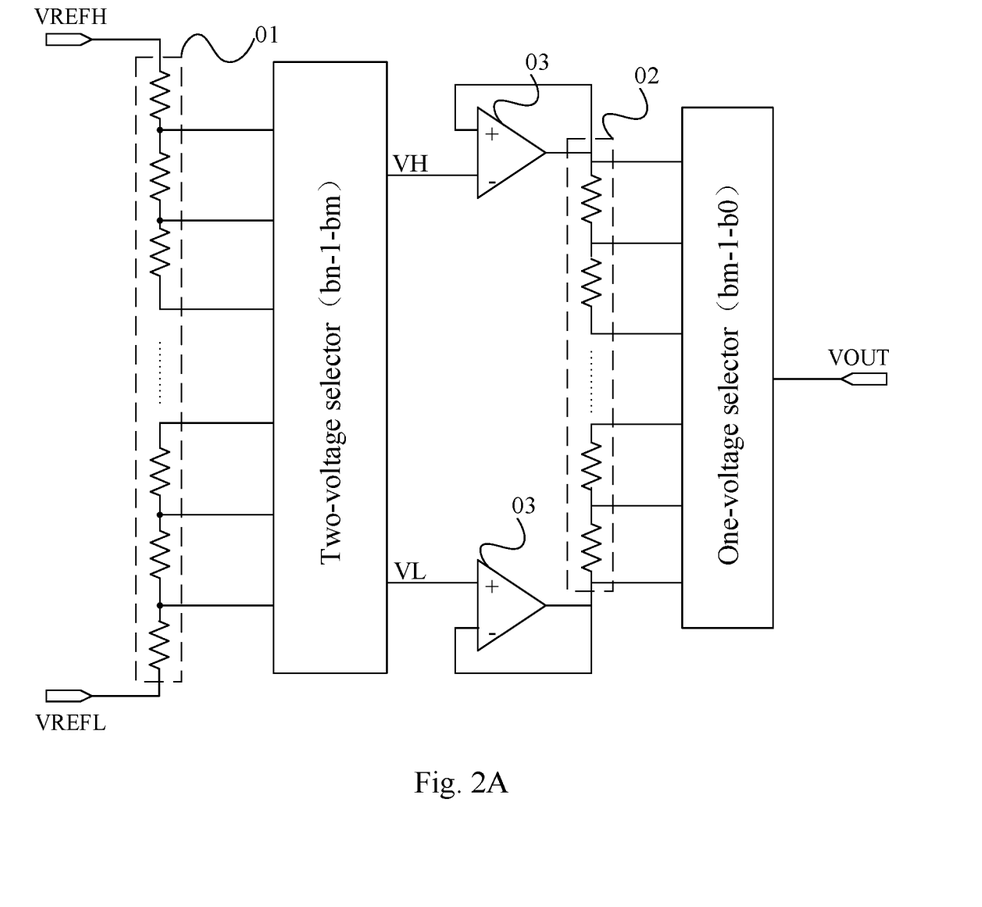
FIG. 2A and FIG. 2B are schematic structural diagrams of a two-stage resistor string DAC in the related art.
Figure 2B:
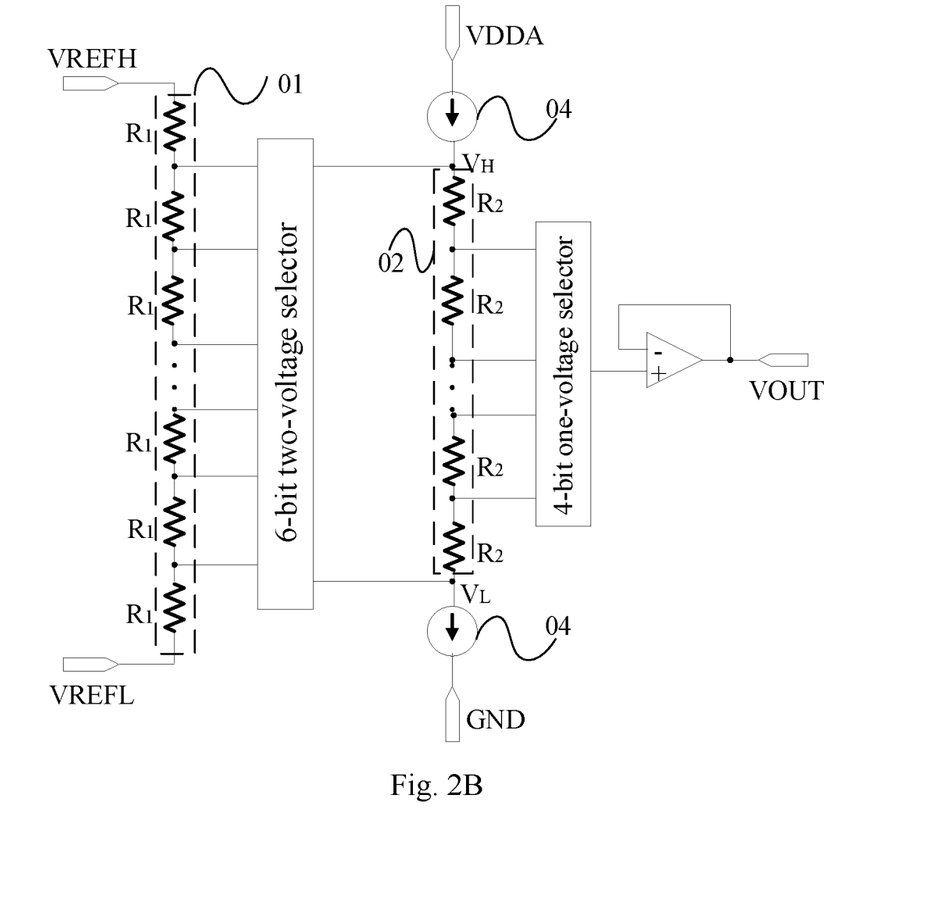

In order to address the problem above, a typical two-stage resistor string DAC is provided as illustrated in FIG. 2A, where the first stage is structured as a global resistor string 01, and two adjacent voltages are selected from the global resistor string 01 using a voltage selector; and the at the second stage, the adjacent voltages obtained from the first stage is sub-divided precisely into final analog voltage using a channel resistor string 02. In order to alleviate a load effect of the channel resistor string 02 at the second stage on the global resistor string 01 at the first stage, two unit gain buffers 03 are inserted between the two stages of resistor strings in the structure. FIG. 2B illustrates a schematic structural diagram of another typical DAC including two stages of resistor strings, where the DAC is also structured as two stages of resistor strings including the first stage for selecting adjacent voltages, and the second stage for precise subdivision. A difference of the DAC in this structure from the structure as illustrated in FIG. 2A lies in two identical current sources 04 inserted between upper and lower ends of the channel resistor string 02 at the second stage.

As compared with the legacy single-stage resistor string DAC, the number of switches in each two-stage resistor string DAC above can be reduced to thereby reduce the area of the chip, but there may be some drawback thereof. For example, in the two-stage DAC as illustrated in FIG. 2A, the two unit gain buffers 03 are inserted between the two stages of resistor strings so that there is an increase in power consumption of the circuit; and voltage of the unit gain buffers 03 may be mistuned due to a process mismatch so that there may be an error in the DAC. In the two-stage DAC as illustrated in FIG. 2B, the current sources 04 are current sources structured as a current mirror including MOS transistors so that the sizes of the current sources 04 may be affected by voltage output from the global resistor string 01 at the first stage due to the MOS channel length modulation effect, thus degrading the precision of the whole DAC.

In view of the description above, the area of the legacy single-stage resistor string DAC is exponentially increasing as the precision thereof is improving, so it may not be applicable to a high-precision application. The area of the two-stage resistor string DAC with the same precision is greatly reduced as compared with the resistor string DAC, but the precision of the two-stage resistor string DAC may be affected due to the isolating circuit introduced for alleviating the load effect of the channel resistor string 02 at the second stage on the global resistor string 01 at the first stage in the DAC, so it is highly desirable to further optimize the structure of the DAC so as to improve the precision thereof while reducing the area thereof.

In view of this, the embodiments of the disclosure provide a digital to analog converter, a method for driving the same, and a display device so as to address the problems that the DAC occupies a large area in a chip, and has high power consumption.

In order to make the objects, technical solutions, and advantages of the disclosure more apparent, the disclosure will be described below in further details with reference to the drawings. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

The shapes and sizes of respective components in the drawings are not intended to reflect any real proportion, but only intended to illustrate the content of the disclosure.

Figure 3:
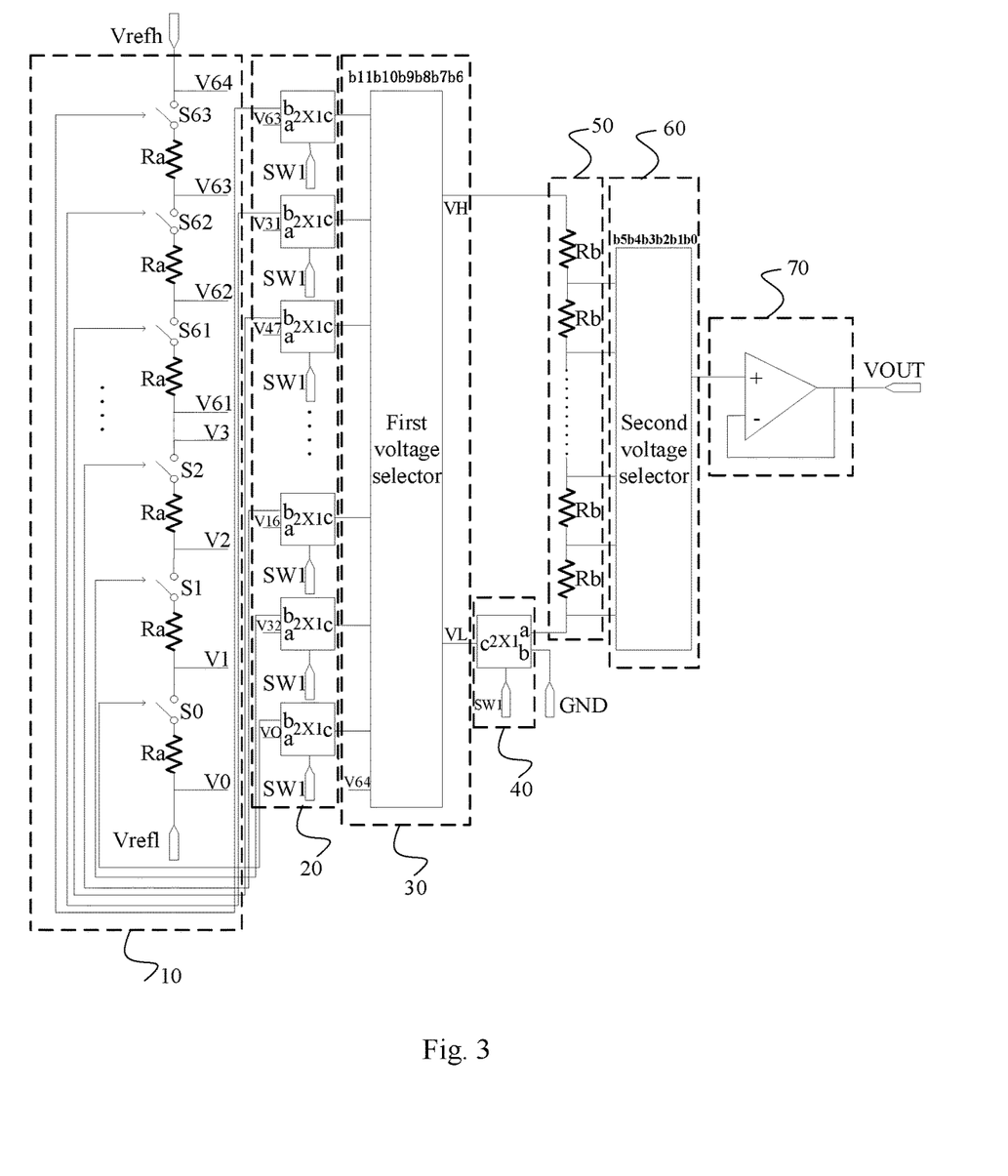
FIG. 3 is a schematic structural diagram in details of a digital to analog converter according to an embodiment of the disclosure.

As illustrated in FIG. 3, a digital to analog converter according to an embodiment of the disclosure includes: a first resistor string 10, $2^m$ first multiplexers 20, a first voltage selector 30, a second resistor string 50, a second voltage selector 60, and a second multiplexer 40.

The first resistor string 10 includes: $2^m$ (e.g., m=6) pairs of first resistors Ra and first switches Sx (x=0, 1, ..., $2^m-1$, $2^n$) connected in series between a high-voltage reference signal terminal Vrefh and a low-voltage reference signal terminal Vrefl, where the respective first resistors Ra have the same resistance, and the respective first switches Sx are initially turned on and the $2^m$ first resistors Ra constitute $(2^m+1)$ first voltage dividing ends Vr (r=0, 1, ..., $2^m-1$, $2^m$) corresponding to $(2^m+1)$ input-output ends of the first voltage selector 30 in a one-to-one manner, where $2^m$ first voltage dividing ends Vr are one-to-one coupled with $2^m$ input-output ends through the $2^m$ first multiplexers 20, and the remaining one first voltage dividing end Vr is coupled directly with the remaining one input-output terminal.

The $2^m$ first multiplexers 20 are configured to connect the $2^m$ input-output ends with control ends of their corresponding $2^m$ first switches Sx upon reception of a first control signal, and to connect the $2^m$ input-output ends with control ends of their corresponding $2^m$ first voltage dividing ends Vr upon reception of a second control signal.

The second resistor string 50 includes $2^n$ (e.g., n=6) second resistors Rb connected in series between a high-voltage terminal VH of the first voltage selector 30, and the second multiplexer 40, where the sum of the resistances of the second resistors Rb is equal to the resistance of a first resistor Ra, and the $2^n$ second resistors Rb constitute $2^n$ second voltage dividing ends.

The second multiplexer 40 is configured to connect the low-voltage terminal VL of the first voltage selector 30 with the ground (GND) upon reception of the first control signal, and to connect the low-voltage terminal VL of the first voltage selector 30 with the second resistor string 50 upon reception of the second control signal.

The first voltage selector 30 is configured, when the low-voltage terminal VL is grounded, to select one of the first switches Sx to be turned off, according to a received m-bit digital signal, and when the low-voltage terminal VL is connected with the second resistor string 50, to select the second resistor string 50, instead of the first resistor Ra paired with the turned off first switch Sx, to be connected in series in the first resistor string 10, according to the received m-bit digital signal.

Where when the low-voltage terminal VL is grounded, the first voltage selector 30 is configured to control one of the 2m first switches to be turned off, and other first switches remains to be turned on.

The second voltage selector 60 is configured to select a voltage signal at one of the second voltage dividing ends for output, according to a received n-bit digital signal.

Specially in the digital to analog converter above according to the embodiment of the disclosure, the $2^m$ first multiplexers 20, the first voltage selector 30, and the second voltage selector 60 operate in cooperation with each other so that the entire second resistor string 50 can be connected in series with the first resistor string 10 for further division to thereby alleviate a load effect of the second resistor string 50 on the first resistor string 10 while reducing the area of a chip, so as to improve the precision of the DAC, and no other circuit is introduced so as not to affect the precision of the DAC, thus improving the competitiveness of the product.

Figure 4:
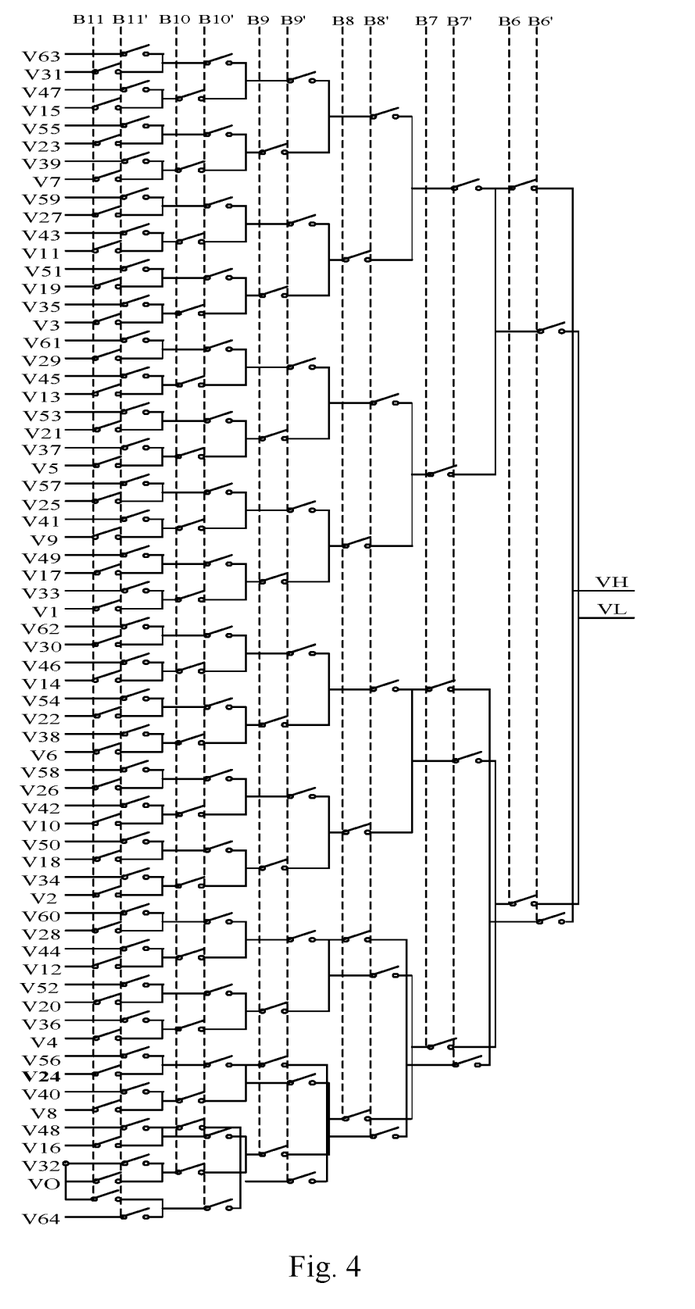
FIG. 4 is a schematic structural diagram in details of a first voltage selector in the digital to analog converter according to the embodiment of the disclosure.
Figure 5:
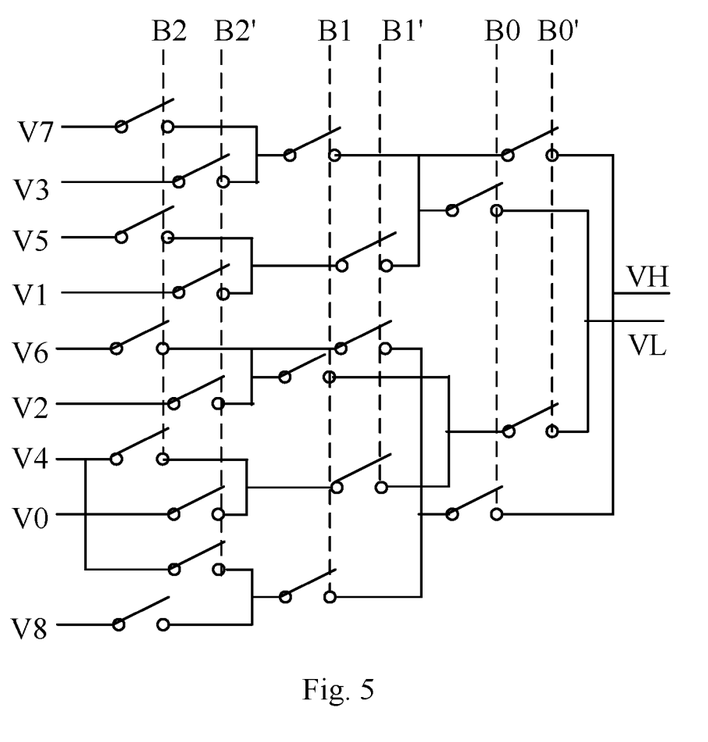
FIG. 5 is another schematic structural diagram in details of the first voltage selector in the digital to analog converter according to the embodiment of the disclosure.

In some embodiments, in the digital to analog converter above according to the embodiment of the disclosure, as illustrated in FIG. 4 (e.g., m=6), the first voltage selector 30 can include a first switch tree with an m-bit binary digital signal, where the first switch tree includes $$2m + \sum_{i=1}^{m} 2^i$$

second switches, the m-bit digital signal is input in a reverse order, and the $(2^m+1)$ input-output ends of the first switch tree are coupled respectively with the $(2^m+1)$ first voltage dividing ends Vr under a preset rule, so that adjacent voltages at the first voltage dividing ends Vr are output respectively at the high-voltage terminal VH and the low-voltage terminal VL of the first voltage selector 30.

Specifically when an m-bit digital signal in a first switch tree is input in a forward order, in order to enable a group of adjacent grayscale voltages to be output, two first switch trees shall cooperate with each other, so there are $$2\sum_{i=1}^{m} 2^i$$

second switches. In the digital to analog converter above according to the embodiment of the disclosure, the m-bit digital signal in the first switch tree is input in a reverse order, the number of switches in the first switch tree can be reduced. When the m-bit digital signal in the first switch tree is input in a reverse order, a group of adjacent grayscale voltages can be output using only $$2m + \sum_{i=1}^{m} 2^i$$

second switches, the number of which is less than the number of second switches when the m-bit digital signal in the first switch tree is input in a forward order, by $$\left( \sum_{i=1}^{m} 2^i - 2m \right),$$

so the area occupied by the first switch tree in the chip can be reduced when the m-bit digital signal in the first switch tree is input in a reverse order.

Particularly in the digital to analog converter above according to the embodiment of the disclosure, with m=6, the first switch tree includes 138 second switches, the number of which is less than the number of second switches in the two switch trees with a 6-bit binary digital signal which is input in a forward order, by 114

$$\left( \left( \sum_{i=1}^{m} 2^i - 2m \right) = (2^6 + 2^5 + 2^4 + 2^3 + 2^2 + 2^1) - 2 \times 6 = 114 \right),$$

and the m-bit digital signal is input in a reverse order (V63, V31, V47, ..., V16, V32, V0, V64), where VL and VH are defined in the equations of:

$$VL = \frac{Vrefh - Vrefl}{2^6} \sum_{i=0}^{5} 2^i b_{i+6} + Vrefl,$$

-continued $$VH = \frac{Vrefh - Vrefl}{2^6}\left\{1 + \sum_{i=0}^{5} 2^i b_{i+6}\right\} + Vrefl.$$

When VL=V0 is selected by the 6-bit digital signal (B11, B10, B9, B8, B7, B6), VH=V1, and when VL=V63, VH=V64, so a group of adjacent grayscale voltages can be output. Alike, taking a switch tree with a 3-bit digital signal as an example, as illustrated in FIG. 3, with m=3, the first switch tree includes 20 second switches, the number of which is less than the number of second switches in the two switch trees with a 3-bit binary digital signal which is input in a forward order, by 8

$$\left(\left(\sum_{i=1}^{m} 2^i - 2m\right) = (2^3 + 2^2 + 2^1) - 2 \times 3 = 8\right),$$

and the 3-bit digital signal is input in a reversed order (V7, V0, V5, V1, V6, V2, V4, V0, V8). When VL=V0 is selected using the 3-bit digital signal (B2, B1, B0), then VH=V1, and when VL=V7, then VH=V8, so a group of adjacent grayscale voltages can be output using the 3-bit binary digital signal.

Figure 6:
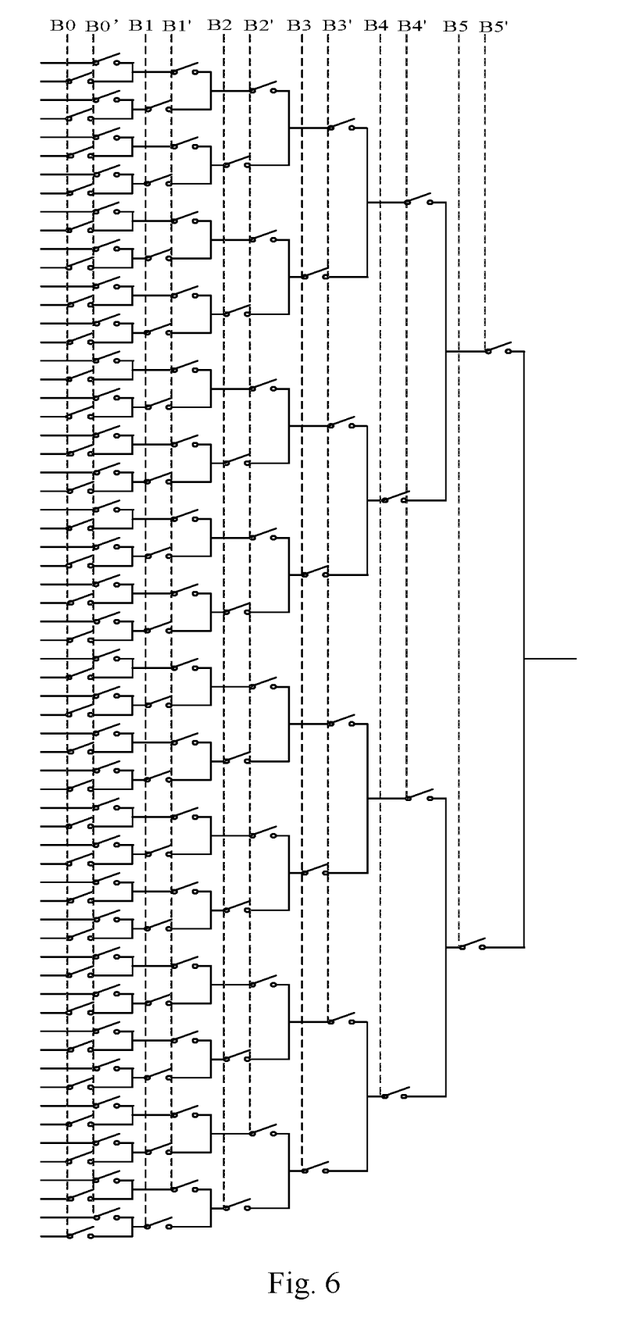
FIG. 6 is a schematic structural diagram in details of a second voltage selector in the digital to analog converter according to the embodiment of the disclosure.

In some embodiments, in the digital to analog converter above according to the embodiment of the disclosure, as illustrated in FIG. 6, the second voltage selector 60 can include a second switch tree with an n-bit binary digital signal, where the second switch tree includes $$\sum_{i=1}^{n} 2^i$$

third switches, the n-bit binary digital signal is input in a forward order, and $2^n$ input ends of the second switch tree are one-to-one coupled with the $2^n$ second voltage dividing ends in a linear input voltage order.

Specifically in the digital to analog converter above according to the embodiment of the disclosure, with n=m, the number of switches in the DAC can be reduced to thereby reduce the area occupied by the DAC in the chip. With n=m=6, the number of switches in the first voltage selector 30 is 138, and the number of switches in the second voltage selector 60 is 126, so the total number of switches in the first voltage selector 30 and the second voltage selector 60 is 264. When n≠m, e.g., with n=7 and m=5, the number of switches in the first voltage selector 30 is 72, and the number of switches in the second voltage selector 60 is 252, so the total number of switches in the first voltage selector 30 and the second voltage selector 60 is 324, where the number of switches in the second voltage selector 60 is more than that when n=6, by 60. Apparently with n=m, the number of switches in the DAC can be reduced to thereby reduce the area occupied by the DAC in the chip.

In some embodiments of the disclosure, in the digital to analog converter above, when m=n, and the resistance of a second resistor Rb is generally $\frac{1}{2}^m$ of that a first resistor Ra.

Specifically the resistance of a second resistor Rb is $\frac{1}{2}^m$ of that a first resistor Ra, so the total sum of the resistance of the second resistors Rb in the second resistor string 50 is equal to the resistance of a first resistor Ra, and thus when the low-voltage terminal VL of the first voltage selector 30 is connected with the second resistor string 50, the second resistor string 50 instead of the first resistor Ra paired with the turned-off first switch Sx can be connected in series to the first resistor string 10, to thereby alleviate a load effect in the DAC including two stages of resistor strings in the related art so as to lower a loss of voltage at the first voltage dividing end Vr, and to improve the linearity of the DAC.

In some embodiments of the disclosure, in the digital to analog converter above, as illustrated in FIG. 3, the $2^m$ first multiplexers 20 have control ends coupled with a control signal terminal SW1, first ends b coupled with their corresponding $2^m$ first voltage dividing ends Vr, second ends a coupled with the control ends of their corresponding $2^m$ first switches Sx, and third ends c coupled with the $2^m$ input-output ends of the first voltage selector.

The second multiplexer 40 has a control end coupled with the control signal terminal SW1, a first end a coupled with the second resistor string 50, a second end b grounded, and a third end c coupled with the low-voltage terminal VL of the first voltage selector.

Specifically the $2^m$ first multiplexers 20 are configured to connect the $2^m$ input-output ends of the first voltage selector with the control ends of their corresponding $2^m$ first switches Sx upon reception of the first control signal, and to connect the $2^m$ input-output ends of the first voltage selector with their corresponding $2^m$ first voltage dividing ends Vr upon reception of the second control signal. The second multiplexer 40 is configured to connect the low-voltage terminal VL of the first voltage selector 30 with the ground (GND), upon reception of the first control signal, and to connect the low-voltage terminal VL of the first voltage selector 30 with the second resistor string 50 upon reception of the second control signal.

Specifically the first control signal can be at a high level signal or a low level signal, and the second control signal can be at a high level signal or a low level signal, although the embodiment of the disclosure will not be limited thereto. When the first control signal is a high level signal, the second control signal is a low level signal; and when the first control signal is a low level signal, the second control signal is a high level signal.

Figure 7:
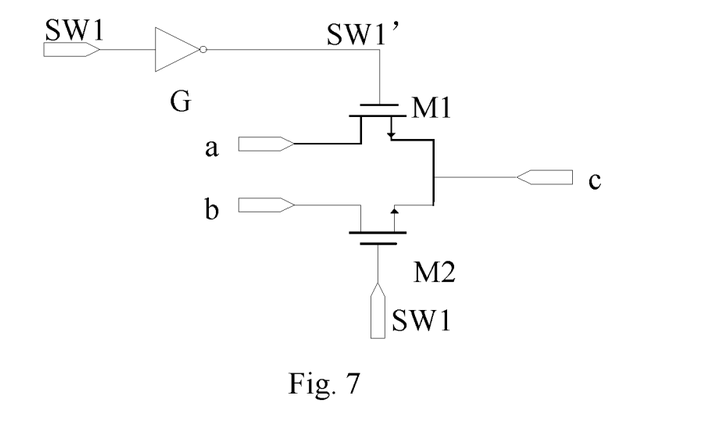
FIG. 7 is a schematic structural diagram in details of a first or second multiplexer selector in the digital to analog converter according to the embodiment of the disclosure.

In some embodiments of the disclosure, in the digital to analog converter above, as illustrated in FIG. 7, the first multiplexer 20 and the second multiplexer 40 each can specifically include: a first thin film transistor M1, a second thin film transistor M2, and an inverter G.

Both an input end of the inverter G and a gate of the second thin film transistor M2 are the control ends, and an output end of the inverter is coupled with a gate of the first thin film transistor M1.

A source of the first thin film transistor M1 is connected with a drain of the second thin film transistor M2, and is the third end c.

A drain of the first thin film transistor M1 is the second end a, and a source of the second thin film transistor M2 is the first end b.

Specifically the inverter G is configured to output a signal, the level of which is opposite to that of a signal of the control signal terminal SW1, to the control end of the first thin film transistor M1.

Specifically both of the first and second thin film transistors M1 and M2 can be N-type thin film transistors or P-type thin film transistors to thereby simplify a fabrication process, although the embodiment of the disclosure will not be limited thereto. When the first thin film transistor M1 is an N-type thin film transistor, it is turned on when a high level is output from the inverter G, and turned off when a low level is output from the inverter G; and when the first thin film transistor M1 is a P-type thin film transistor, it is turned on when a low level is output from the inverter G, and turned off when a high level is output from the inverter G. When the second thin film transistor M2 is an N-type thin film transistor, it is turned on when a high level is applied to the control signal terminal SW1, and turned off when a low level is applied to the control signal terminal SW1; and when the second thin film transistor M2 is a P-type thin film transistor, it is turned on when a low level is applied to the control signal terminal SW1, and turned off when a high level is applied to the control signal terminal SW1.

In some embodiments of the disclosure, in the digital to analog converter above, as illustrated in FIG. 3, the digital to analog converter can further include a buffer 70 connected with a voltage output end of the second voltage selector 60.

Specifically in the digital to analog converter above according to the embodiment of the disclosure, the buffer 70 can be connected with the voltage output end of the second voltage selector 60 to thereby improve the driving capacity of the DAS.

Figure 8:
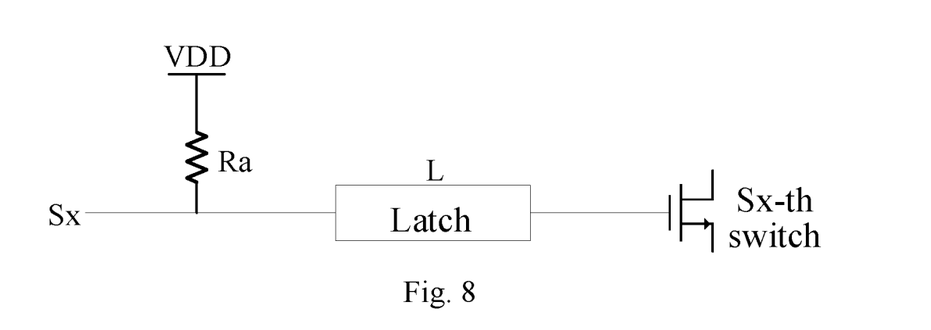
FIG. 8 is a schematic diagram in details of a latch in the digital to analog converter according to the embodiment of the disclosure.

In some embodiments of the disclosure, in the digital to analog converter above, as illustrated in FIG. 8, the digital to analog converter can further include a latch L connected between the input-output end and the control end of its corresponding first switch Sx.

Specifically when the first voltage selector 30 selects one of the first switches Sx to be turned off, according to the received m-bit digital signal, the turned-on or turned-off state of the first switch Sx in the first resistor string 10 can be stored in the latch L for a period.

Based upon the same inventive idea, an embodiment of the disclosure further provides a display device including the digital to analog converter according to any one of the technical solutions above. The display device can be a mobile phone, a tablet computer, a TV set, a monitor, a notebook computer, a digital photo frame, a navigator, or any other product or component with a display function. Reference can be made to the embodiment of the digital to analog converter above for an implementation of the display device, so a repeated description thereof will be omitted here.

Figure 9:
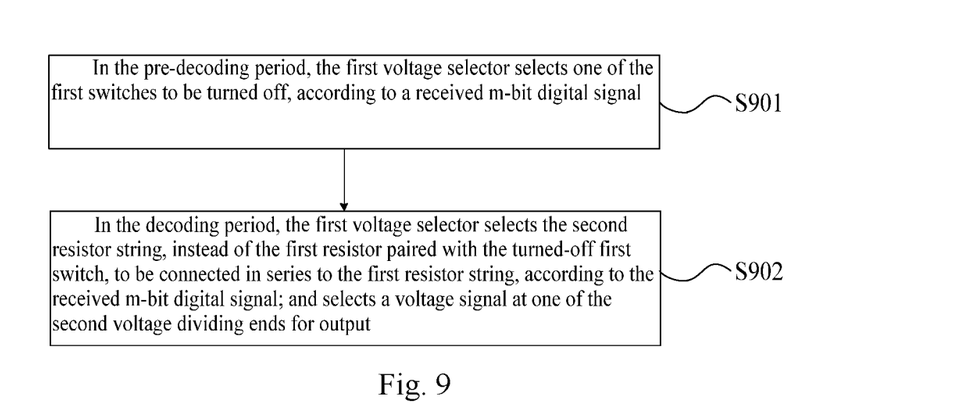
FIG. 9 is a flow chart of a method for driving a digital to analog converter according to the embodiment of the disclosure.

Based upon the same inventive idea, an embodiment of the disclosure further provides a method for driving the digital to analog converter according to any one of the technical solutions above, and as illustrated in FIG. 9, the method includes a pre-decoding period and a decoding period.

In the step S901, in the pre-decoding period, the first voltage selector selects one of the first switches to be turned off, according to a received m-bit digital signal.

In the step S902, in the decoding period, the first voltage selector selects the second resistor string, instead of the first resistor paired with the turned-off first switch, to be connected in series to the first resistor string, according to the received m-bit digital signal; and the second voltage selector selects a voltage signal at one of the second voltage dividing ends for output. Stated otherwise, the first voltage selector can select the specific levels at the low-voltage terminal VL and the high-level terminal VH of the first voltage selector 30 according to the m-bit digital signal, and the second voltage selector can further select specific voltage signals at the low-voltage terminal VL and the high-level terminal VH according to an n-bit digital signal.

In the digital to analog converter, the method for driving the same, and the display device according to the embodiments of the disclosure, the digital to analog converter includes: a first resistor string, $2^m$ first multiplexers, a first voltage selector, a second resistor string, a second voltage selector, and a second multiplexer, where the first resistor string includes: $2^m$ pairs of first resistors and first switches connected in series between a high-voltage reference signal terminal and a low-voltage reference signal terminal, where the $2^m$ first resistors in the first resistor string constitute ($2^m$+1) first voltage dividing ends; the $2^m$ first multiplexers are configured to connect $2^m$ input-output ends with control ends of their corresponding $2^m$ first switches upon reception of a first control signal, and the second multiplexer is configured to connect a low-voltage terminal of the first voltage selector with the ground so that the first voltage selector selects one of the first switches to be turned off, according to a received m-bit digital signal; and the $2^m$ first multiplexers are configured to connect the $2^m$ input-output ends with their corresponding $2^m$ first voltage dividing ends upon reception of a second control signal, and the second multiplexer is configured to connect the low-voltage terminal of the first voltage selector with the second resistor string so that the first voltage selector selects the second resistor string, instead of the first resistor paired with the turned-off first switch, to be connected in series to the first resistor string, according to a received m-bit digital signal, and the second voltage selector selects a voltage signal at one of second voltage dividing ends for output, according to a received n-bit digital signal. The entire second resistor string can be connected in series with the first resistor string for further division to thereby alleviate a load effect of the second resistor string on the first resistor string while reducing the area of a chip, so as to improve the precision of the DAC, and no other circuit is introduced so as not to affect the precision of the DAC, thus improving the competitiveness of the product.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A digital to analog converter, comprising: a first resistor string, $2^m$ first multiplexers, a first voltage selector, a second resistor string, a second voltage selector, and a second multiplexer, wherein:

the first resistor string comprises: $2^m$ pairs of first resistors and first switches connected in series between a high-voltage reference signal terminal and a low-voltage reference signal terminal, wherein the first resistors have same resistance, and the first switches are initially turned on; and the $2^m$ first resistors constitute ($2^m$+1) first voltage dividing ends, the ($2^m$+1) first voltage dividing ends one-to-one corresponding to ($2^m$+1) input-output ends of the first voltage selector, wherein $2^m$ first voltage dividing ends are one-to-one coupled with $2^m$ input-output ends through the $2^m$ first multiplexers, and the remaining one first voltage dividing end is coupled directly with the remaining one input-output end;

the $2^m$ first multiplexers are configured to connect the $2^m$ input-output ends with control ends of their corresponding $2^m$ first switches upon reception of a first control signal, and to connect the $2^m$ input-output ends with their corresponding $2^m$ first voltage dividing ends upon reception of a second control signal;

the second resistor string comprises $2^n$ second resistors connected in series between a high-voltage terminal of the first voltage selector and the second multiplexer, wherein a sum of the resistances of the $2^n$ second resistors is equal to the resistance of a first resistor, and the $2^n$ second resistors constitute $2^n$ second voltage dividing ends;

the second multiplexer is configured to connect a low-voltage terminal of the first voltage selector with ground upon reception of the first control signal, and to connect the low-voltage terminal of the first voltage selector with the second resistor string upon reception of the second control signal;

the first voltage selector is configured to select one of the first switches to be turned off, according to a received m-bit digital signal when the low-voltage terminal is grounded, and to select the second resistor string, instead of the first resistor paired with the turned-off first switch, to be connected in series to the first resistor string, according to the received m-bit digital signal when the low-voltage terminal is connected with the second resistor string; and the second voltage selector is configured to select a voltage signal at one of the second voltage dividing ends for output, according to a received n-bit digital signal.

2. The digital to analog converter according to claim 1, wherein the first voltage selector comprises a first switch tree with an m-bit binary digital signal, wherein the first switch tree comprises $$2m + \sum_{i=1}^{m} 2^i$$

second switches, the m-bit binary digital signal is input in a reverse order, and $(2^m+1)$ input-output ends of the first switch tree are coupled respectively with the $(2^m+1)$ first voltage dividing ends under a preset rule, so that adjacent voltages at the first voltage dividing ends are output respectively at the high-voltage terminal and the low-voltage terminal of the first voltage selector.

3. The digital to analog converter according to claim 1, wherein the second voltage selector comprises a second switch tree with an n-bit binary digital signal, wherein the second switch tree comprises $$\sum_{i=1}^{n} 2^i$$

third switches, the n-bit binary digital signal is input in a forward order, and $2^n$ input terminals of the second switch tree are one-to-one coupled with the $2^n$ second voltage dividing ends in a linear input voltage order.

4. The digital to analog converter according to claim 1, wherein m=n, and a resistance of each of the second resistors is $\frac{1}{2^m}$ of the resistance of the first resistor.

5. The digital to analog converter according to claim 1, wherein the $2^m$ first multiplexers have control ends coupled with a control signal terminal, first ends coupled with their corresponding $2^m$ first voltage dividing ends, second ends coupled with the control ends of their corresponding $2^m$ first switches, and third ends coupled with the $2^m$ input-output ends; and the second multiplexer has a control end coupled with the control signal terminal, a first end coupled with the second resistor string, a second end grounded, and a third end coupled with the low-voltage terminal.

6. The digital to analog converter according to claim 5, wherein the first multiplexer and the second multiplexer each comprises: a first thin film transistor, a second thin film transistor, and an inverter, wherein:

both an input end of the inverter, and a gate of the second thin film transistor are the control ends, and an output end of the inverter is coupled with a gate of the first thin film transistor;

a source of the first thin film transistor is connected with a drain of the second thin film transistor, and is the third end; and a drain of the first thin film transistor is the second end a, and a source of the second thin film transistor is the first end.

7. The digital to analog converter according to claim 1, further comprising a buffer connected with a voltage output end of the second voltage selector.

8. The digital to analog converter according to claim 1, further comprising a latch connected between one of the input-output ends and the control end of its corresponding first switch.

9. A display device, comprising the digital to analog converter according to claim 1.

10. A method for driving the digital to analog converter according to claim 1, the method comprising: a pre-decoding period and a decoding period, wherein:

in the pre-decoding period, selecting, by the first voltage selector, one of the first switches to be turned off, according to a received m-bit digital signal; and in the decoding period, selecting, by the first voltage selector, the second resistor string, instead of the first resistor paired with the turned-on first switch, to be connected in series to the first resistor string, according to the received m-bit digital signal, and selecting, by the second voltage selector, a voltage signal at one of the second voltage dividing ends for output, according to a received n-bit digital signal.

* * * * *